US011855585B2

(12) United States Patent
Jany et al.

(10) Patent No.: US 11,855,585 B2
(45) Date of Patent: Dec. 26, 2023

(54) DEVICE AND METHOD FOR RECEIVING AND DEMODULATING AN AMPLITUDE-MODULATED RF SIGNAL

(71) Applicant: COMMISSARIAT A L'ENERGIE ATOMIQUE ET AUX ENERGIES ALTERNATIVES, Paris (FR)

(72) Inventors: Clément Jany, Grenoble (FR); Baudouin Martineau, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 235 days.

(21) Appl. No.: 17/305,725

(22) Filed: Jul. 14, 2021

(65) Prior Publication Data
US 2022/0021339 A1 Jan. 20, 2022

(30) Foreign Application Priority Data
Jul. 17, 2020 (FR) ..................................... 20 07514

(51) Int. Cl.
*H04L 27/36* (2006.01)
*H03C 5/00* (2006.01)
*H01Q 1/36* (2006.01)
*H03C 3/40* (2006.01)

(52) U.S. Cl.
CPC .................. *H03C 5/00* (2013.01); *H01Q 1/36* (2013.01); *H03C 3/40* (2013.01)

(58) Field of Classification Search
CPC ............... H03C 5/00; H03C 3/40; H01Q 1/36
USPC .................................. 375/298, 295, 219, 316
See application file for complete search history.

(56) References Cited

U.S. PATENT DOCUMENTS

2007/0206702 A1 9/2007 Adler et al.
2009/0156155 A1 6/2009 Krug et al.
2015/0110224 A1* 4/2015 Kang ...................... H04L 27/04
375/300

OTHER PUBLICATIONS

French Preliminary Search Report dated Mar. 12, 2021 in French Application 20 07514 filed on Jul. 17, 2020, 2 pages (with English Translation of Categories of Cited Documents).
Poon et al., "Supporting and Enabling Circuits for Antenna Arrays in Wireless Communications", Proceedings of the IEEE, vol. 100, issue 7, Jul. 2012, 2207-2218.

* cited by examiner

*Primary Examiner* — Zewdu A Kassa
(74) *Attorney, Agent, or Firm* — Oblon, McClelland, Maier & Neustadt, L.L.P.

(57) ABSTRACT

A device for receiving and demodulating an amplitude-modulated RF signal, comprising: a first antenna; a first amplifier coupled to the first antenna; a receiving module including: a) a second antenna; b) a second amplifier coupled to the second antenna; c) a phase-shifter coupled to the second amplifier and applying a phase-shift Φ; d) a mixer comprising inputs coupled to the phase-shifter and to the first amplifier, and outputting a product of signals received at the input, and wherein the value of the phase-shift Φ is such that the device performs a demodulation of the RF signal when a wavefront of the RF signal forms, with an axis of alignment of the antennas, an angle α having a particular value a which depends on the phase-shift Φ and on a distance between the antennas.

15 Claims, 2 Drawing Sheets

DEVICE AND METHOD FOR RECEIVING AND DEMODULATING AN AMPLITUDE-MODULATED RF SIGNAL

TECHNICAL FIELD

This document concerns a device and a method for receiving and demodulating an amplitude-modulated RF, or radiofrequency, signal. Advantageously, one embodiment of the invention is used in an integrated radiofrequency emission network, for example in the communication, radar, or imaging fields.

PRIOR ART

Millimeter-wave bands (frequencies comprised between about 30 and 300 GHz) are used for high-rate communications as they allow for a high bandwidth and in some cases access to wide unlicensed bands (for example the 57-66 GHz band). For short-range communication applications (several millimeters to a few centimeters), the energy consumption is a very important parameter to be considered, in particular for outdoor applications (mobiles, tablets . . . ).

OOK ("On-Off Keying") modulation is particularly suited to this context of high-rate and low-consumption communications, in particular because it is possible to demodulate a received signal without having to resort to a frequency synthesis, and is thus energy-efficient.

For such communications, the use of a phased array antenna allows increasing the gain of the equivalent antenna. When the phase of the array is programmable, it is even possible to define the direction in which the main lobe of the radiation diagram of the antenna points and thus aim at a particular area of the space.

The document of A. Pool et al., "Supporting and Enabling Circuits for Antenna Arrays in Wireless Communications", Proceedings of the IEEE, Vol. 100, Issue 7, July 2012, pp. 2207-2218, describes several architectures comprising phased array antennas. Nonetheless, all of these architectures cannot be applied to the so-called millimeter-wave frequencies. In addition, these complex architectures require a local oscillator which is a substantial energy consumer.

DISCLOSURE OF THE INVENTION

Thus there is a need to provide a device for receiving and demodulating an amplitude-modulated RF signal that can be applied to millimeter-wave bands, allowing, like the architectures comprising phased array antennas of the prior art, increasing the gain of the equivalent antenna and defining the direction in which the main lobe of the radiation diagram of the antenna points but whose electric consumption is lower and which is as simple to make as these architectures, and which also allows performing a direct demodulation of the amplitude-modulated RF signal.

For this purpose, one embodiment provides a device for receiving and demodulating an amplitude-modulated RF signal, comprising at least:
- a first antenna;
- a first amplifier comprising an input electrically coupled to an output of the first antenna;
- a receiving module including:
  - a) a second antenna;
  - b) a second amplifier comprising an input electrically coupled to an output of the second antenna;
  - c) a phase-shifter comprising an input electrically coupled to an output of the second amplifier and configured to apply a phase-shift CP to a signal received on its input;
  - d) a mixer comprising a first input electrically coupled to an output of the phase-shifter and a second input electrically coupled to an output of the first amplifier, and configured to output a product of signals applied on its first and second inputs, and wherein the value of the phase-shift $\Phi$ is such that the device is configured to perform a demodulation of the amplitude-modulated RF signal received by the first and second antennas when a wavefront of the amplitude-modulated RF signal forms, with an axis of alignment of the first and second antennas, an angle $\alpha$ having a particular value a which depends on that of the phase-shift $\Phi$ and on that of a distance between the first and second antennas.

In this device, the signal received by the second antenna is phase-shifted in order to "compensate for" the advance or the delay with which this signal is received with respect to that received by the first antenna, and thus time-align the signals outputted by the first and second antennas. The product of these two signals performed afterwards allows demodulating directly, in real-time, the RF signal by translating the useful energy of the RF signal in the baseband.

Furthermore, by defining the value of the phase-shift $\Phi$, it is possible to select the direction with which the amplitude-modulated RF signal should be received in order to be able to be demodulated.

This device does not require a local oscillator, which simplifies making thereof and allows having a lower electric consumption than the architectures using a local oscillator.

The device is suited to perform a reception and a demodulation of an amplitude-modulated RF signal according to any type of amplitude modulation, whether digital or analog (for example a Pulse-Amplitude Modulation or PAM). Nonetheless, it is particularly well suited to perform a reception and a demodulation of an amplitude-modulated RF signal according to a digital amplitude modulation such as an OOK or ASK (Amplitude-Shift Keying) modulation.

The device may comprise n receiving modules, n being an integer greater than or equal to 2, each including:
- an antenna;
- an amplifier comprising an input electrically coupled to an output of the antenna of said receiving module;
- a phase-shifter comprising an input electrically coupled to an output of the amplifier of said receiving module and configured to apply the phase-shift $\Phi$ to a signal received on its input, the value of the phase-shift $\Phi$ being similar for all phase-shifters of the n receiving modules;
- a mixer comprising a first input electrically coupled to an output of the phase-shifter of said receiving module and a second input electrically coupled to the output of an amplifier whose input is electrically coupled to an antenna to that of said receiving module, and configured to output a product of signals applied on its first and second inputs;

and wherein the antennas of the n receiving modules and the first antenna are aligned next to one another on the axis of alignment and such that the distances between each of the first antenna and of the antennas of the n receiving modules and an adjacent antenna are equal to one another.

In this device, the receiving module that includes the second antenna and the second amplifier corresponds to one of the n receiving modules.

The device may further include a circuit comprising several inputs electrically coupled to the outputs of the mixers of the n receiving modules and configured to perform a linear combination between signals applied on its inputs. By combining the products of signals obtained at the output of the mixers in this manner, the signal-to-noise ratio of the signal obtained at the output of the circuit is better than that obtained for each of the signals obtained at the output of the mixers. Advantageously, the linear combination may correspond to an addition.

The device may further include n−1 power dividers each comprising:
- an input electrically coupled to the output of the amplifier of one of the n receiving modules;
- a first output electrically coupled to the input of the phase-shifter of said one of then receiving modules;
- a second output electrically coupled to the second input of the mixer of another one of the n receiving modules whose antenna is adjacent to that of said one of n receiving modules.

The receiving module, or each of the n receiving modules, may further include a low-pass filter whose input is electrically coupled to an output of the mixer of said receiving module, and when the device includes the circuit configured to perform a linear combination between the signals applied on its inputs, the inputs of said circuit may be electrically coupled to the outputs of the low-pass filters of the n receiving modules. Such low-pass filters allow improving the spectrum of the demodulated signal obtained by suppressing the high frequencies present in the demodulated signal and thus keep only the useful information in the baseband.

A distance between two adjacent antennas of said device may be equal to $\lambda/2$, with $\lambda$ corresponding to the wavelength of a carrier of the amplitude-modulated RF signal.

The phase-shifter of the receiving module or of each of the n receiving modules may include at least one vector modulator, and/or the mixer of the receiving module or of each of the n receiving modules may include at least one Gilbert cell.

Another embodiment relates to a method for receiving an amplitude-modulated RF signal, comprising at least:
- a reception of the amplitude-modulated RF signal by at least first and second antennas which output respectively the first and second reception signals, then
- an amplification of the first and second reception signals, then
- a phase-shifting $\Phi$ of the amplified second reception signal, then
- a multiplication of the amplified first reception signal with the amplified and phase-shifted second reception signal, and wherein the value of the phase-shift $\Phi$ is defined prior to the reception of the amplitude-modulated RF signal as a function of a particular value a of an angle $\alpha$ formed between a wavefront of the amplitude-modulated RF signal and an axis of alignment of the first and second antennas and of a value of a distance between the first and second antennas.

The method may be such that:
- the reception of the amplitude-modulated RF signal is implemented by n+1 antennas which output n+1 reception signals and which are arranged such that the distance between each of the n+1 antennas and an adjacent antenna are equal to one another;
- the amplification is implemented for each of the n+1 reception signals;
- the phase-shifting $\Phi$ is implemented for n amplified reception signals;
- the multiplication is implemented between each of the n amplified and phase-shifted reception signals and one of the n+1 amplified and non-phase-shifted reception signals originating from two of the n+1 antennas that are adjacent;
- n being an integer greater than or equal 2.

The method may further include the implementation of a linear combination of the signals corresponding to the results of the implemented multiplications.

The method may further include the implementation of a low-pass filtering of the signal corresponding to the result of the implemented multiplication or of each of the signals corresponding to the results of the implemented multiplications.

A distance between two adjacent antennas used for the reception of the amplitude-modulated RF signal may be equal to $\lambda/2$, with $\lambda$ corresponding to the wavelength of a carrier of the amplitude-modulated RF signal.

BRIEF DESCRIPTION OF THE DRAWINGS

The present invention will be better understood upon reading the description of embodiments provided for merely indicative purposes and without limitation, with reference to the appended drawings wherein.

Identical, similar or equivalent portions of the different figures described hereinafter bear the same reference numerals so as to facilitate switching from one figure to another.

The different portions shown in the figures are not necessarily plotted at a uniform scale, to make the figures more readable.

Different possibilities (variants and embodiments) should be understood as not exclusive of one another and could be combined together.

DETAILED DISCLOSURE OF PARTICULAR EMBODIMENTS

Figure 1:
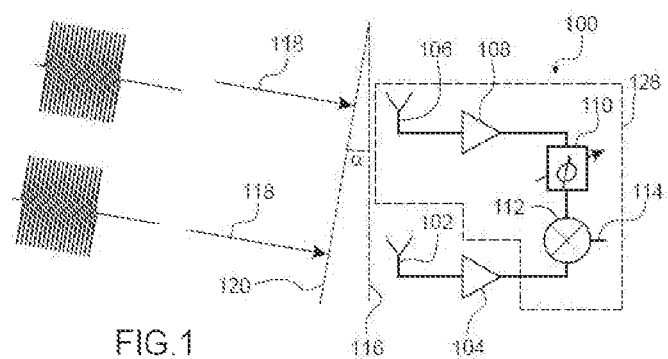
FIG. 1 schematically shows a device for receiving an amplitude-modulated RF signal according to a first embodiment.

A device 100 for receiving an amplitude-modulated RF signal according to a first embodiment is described hereinbelow with reference to FIG. 1 which schematically shows such a device 100.

The device 100 includes a first antenna 102 whose output is electrically coupled to the input of a first amplifier 104.

The device 100 also includes a second antenna 106 whose output is electrically coupled to the input of a second amplifier 108.

The device 100 also includes a phase-shifter 110 whose input is electrically coupled to the output of the second amplifier 108. The phase-shifter 110 is configured to apply a phase-shift $\Phi$ to the signal received on its input, that is to say the RF signal received by the second antenna 106 and amplified by the second amplifier 108. In the example of FIG. 1, the value of the phase-shift $\Phi$ applied by the phase-shifter 110 could be adjusted. According to one embodiment, the phase-shifter 110 corresponds to a vector modulator.

The device 100 further includes a mixer 112 comprising a first input electrically coupled to the output of the phase-shifter 110 and a second input electrically coupled to the output of the first amplifier 104. The mixer 112 is configured to output on an output 114 a product of the signals applied on its first and second inputs, that is to say the product of the signal received by the first antenna 102 and amplified by the first amplifier 104 and of the signal received by the second antenna 106, amplified by the second amplifier 108 and phase-shifted by the phase-shifter 110. According to one embodiment, the mixer 112 corresponds to a Gilbert cell.

The device 100 is configured to receive and demodulate an amplitude-modulated RF signal when this signal arrives with a particular orientation with respect to an axis of alignment 116 of the first and second antennas 102, 106. In FIG. 1, this particular orientation corresponds to a direction of propagation 118. The wavefront of the amplitude-modulated RF signal according to the direction of propagation 118 is denoted, in FIG. 1, by the reference numeral 120 and is perpendicular to the direction of propagation 118. This wavefront 120 forms an angle α with the axis of alignment 116. Hence, the particular orientation of the RF signal for which the device 100 performs the demodulation of the RF signal also corresponds to a particular value of the angle α, called a.

The value a depends on the distance between the first and second antennas 102, 106 and on the value of the phase-shift Φ applied by the phase-shifter 110. Indeed, in the configuration of the device 100 as shown in FIG. 1, the RF signal to be demodulated is received by the second antenna 106 in advance with respect to the first antenna 102. The value of this advance depends on the distance between the first and second antennas 102, 106 as well as the value of the angle α. The phase-shift Φ applied by the phase-shifter 110 to the signal received by the second antenna 106 compensates for this advance so that the signals applied on the two inputs of the mixer 112 are in phase with each other and therefore time-aligned with each other. The product of these signals obtained on the output 114 of the mixer 112 corresponds to the demodulate RF signal. The multiplication performed by the mixer 112 corresponds to a translation of the useful energy of the RF signal in the baseband.

By defining, prior to the reception of the amplitude-modulated RF signal, the value of the phase-shift Φ as a function of the desired value a of the angle α, and by taking into account the distance between the two antennas 102, 106, the device 100 is then configured so that only the RF signals forming the angle α=a are properly demodulated by the device 100, and that other RF signals, whose wavefront forms an angle with value different from a with the axis of alignment 116, are not demodulated by the device 100 because the product of these signals would not reflect the information transmitted by the amplitude-modulated RF signal.

Figure 2:
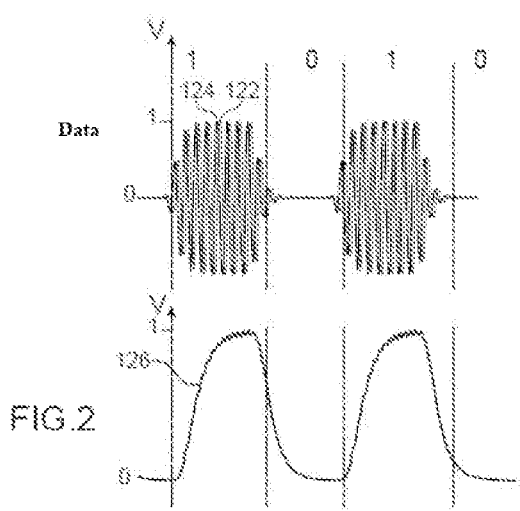
FIG. 2 shows examples of signals obtained in the device for receiving an amplitude-modulated RF signal according to the first embodiment.

FIG. 2 shows examples of signals obtained in the device 100 when the wavefront 120 of the RF signal received by the device 100 forms an angle α=a with the axis of alignment 116. The amplitude-modulated RF signal received by the antennas 102, 106 herein corresponds to an OOK modulated signal. The reference numerals 122 and 124 refer to the reception signals obtained at the output of the first and second antennas 102, 106 respectively. The reference numeral 126 refers to the baseband demodulated signal obtained at the output of the mixer 114, and which corresponds to the useful information transmitted by the amplitude-modulated RF signal.

In the device 100 described before with reference to FIG. 1, the second antenna 106, the second amplifier 108, the phase-shifter 110 and the mixer 112 form together a receiving module 128 cooperating with the first antenna 102 and the first amplifier 104. Alternatively, the device 100 may include several receiving modules similar to the receiving module 128.

A device 100 for receiving an amplitude-modulated RF signal according to a second embodiment is described hereinbelow with reference to FIG. 3 which schematically shows such a device 100.

In contrast with the device 100 according to the previously-described first embodiment which includes one single receiving module 128, the device 100 according to the second embodiment includes n receiving modules 128.1-128.n, n being an integer greater than or equal to 2.

Each of then receiving modules 128.1-128.n includes an antenna 106.1-106.n and an amplifier 108.1-108.n comprising an input electrically coupled to an output of the antenna 106.1-106.n of the receiving module.

Each of the modules 128.1-128.n also includes a phase-shift 110.1-110.n comprising an input electrically coupled to an output of the amplifier 108.1-108.n of the receiving module and configured to apply a phase-shift Φ to a signal received on its input. The value of the phase-shift Φ is similar for all phase-shifters 110.1-110.n of the n receiving modules 128.1-128.n.

Each of the modules 128.1-128.n also includes a mixer 112.1-112.n comprising a first input electrically coupled to an output of the phase-shift 110.1-110.n of the receiving module and a second input electrically coupled to the output of one of the amplifiers 108.2-108.n and 104 whose input is coupled to one of the antennas 106.2-106.n and 102 adjacent to that of the receiving module. In the example of FIG. 3, the second input of the mixer 112.1 of the receiving module 128.1 is electrically coupled to the output of the amplifier 108.2 whose input is electrically coupled to the antenna 106.2 which is adjacent to the antenna 106.1. Similarly, the second input of the mixer 112.2 of the receiving module 128.2 is electrically coupled to the output of the amplifier 108.3 whose input is electrically coupled to the antenna 106.3 which is adjacent to the antenna 106.2. Finally, the second input of the mixer 112.n of the receiving module 128.n is electrically coupled to the output of the amplifier 104 whose input is electrically coupled to the antenna 102 that is adjacent to the antenna 106.n. Each of the mixers 112.1-112.n is configured to output on its output a signal corresponding to the product of signals applied on its first and second inputs.

In this device 100 according to the second embodiment, the antennas 106.1-106.n of the n receiving modules 128.1-128.n and the first antenna 102 are aligned next to one another on the axis of alignment 116 and are such that the distances between two adjacent antennas selected amongst the first antenna 102 and the antennas 106.1-106.n of then receiving modules 128.1-128.n are equal to one another, and herein equal to λ/2, with λ corresponding to the wavelength of a carrier of the amplitude-modulated RF signal intended to be received and demodulated by the device 100. In the example of FIG. 3, the distance between the first antenna 102 and the antenna 106.n that are adjacent to one another is equal to the distance between the antennas 106.2 and 106.3 that are adjacent to one another, and also equal to the distance between the antennas 106.2 and 106.1 that are adjacent to one another.

Figure 3:
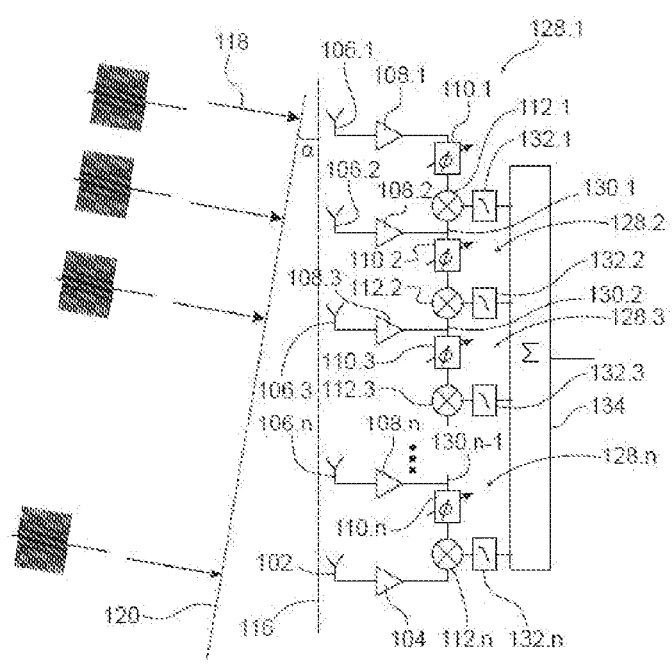
FIG. 3 schematically shows a device for receiving an amplitude-modulated RF signal according to a second embodiment.

The device 100 shown in FIG. 3 also includes n−1 power dividers 130.1-130.n−1 each comprising:
an input electrically coupled to the output of the amplifier 108.2-108.n of one of the n receiving modules 128.2-128.n;
a first output electrically coupled to the input of the phase-shifter 110.2-110.n of said one of then receiving modules 128.2-128.n;
a second output electrically coupled to the second input of the mixer 112.1-112.n−1 of another one of the n receiving modules whose antenna 106.1-106.n−1 is adjacent to that of said one of the n receiving modules 128.2-128.n.

In this second embodiment, each of the receiving modules 128.1-128.n also includes a low-pass filter 132.1-132.n whose input is electrically coupled to an output of the mixer 112.1-112.n of said receiving module 128.1-128.n. Such a low-pass filter may also be coupled to the output of the mixer 114 of the device 100 according to the first embodiment.

The device 100 also includes a circuit 134 configured to perform a linear combination between the signals applied on its inputs and which correspond to the signals obtained at the output of the low-pass filters 132.1-132.n. In the example of FIG. 3, the linear combination performed by the circuit 134 corresponds to an addition. Alternatively, other types of linear combinations are possible.

As in the first embodiment, by defining, prior to the reception of the amplitude-modulated RF signal, the value of the phase-shift D as a function of the desired value a of the angle α, and by taking into account the distance between two adjacent antennas selected amongst the antennas 102 and 106.1-106.n, the device 100 is then configured so that only the RF signals forming the angle α=a are properly modulated by the device 100. The signal obtained at the output of each of the mixers 112.1-112.n is similar to the signal 126 described before with reference to FIG. 2. By performing a linear combination such as an addition on these signals, the signal/noise ratio obtained at the output of the circuit 134 is then improved.

The invention claimed is:

1. A device for receiving and demodulating an amplitude-modulated RF signal, comprising at least:
a first antenna;
a first amplifier comprising an input electrically coupled to an output of the first antenna;
a receiving module including:
a) a second antenna;
b) a second amplifier comprising an input electrically coupled to an output of the second antenna;
c) a phase-shifter comprising an input electrically coupled to an output of the second amplifier and configured to apply a phase-shift Φ to a signal received on its input;
d) a mixer comprising a first input electrically coupled to an output of the phase-shifter and a second input electrically coupled to an output of the first amplifier, and configured to output a product of signals applied on its first and second inputs,
and wherein the value of the phase-shift Φ is such that the device is configured to perform a demodulation of the amplitude-modulated RF signal received by the first and second antennas when a wavefront of the amplitude-modulated RF signal forms, with an axis of alignment of the first and second antennas, an angle α having a particular value α which depends on that of the phase-shift Φ and on that of a distance between the first and second antennas.

2. The device according to claim 1, comprising n receiving modules, n being an integer greater than or equal to 2, each including:
an antenna;
an amplifier comprising an input electrically coupled to an output of the antenna of said receiving module;
a phase-shifter comprising an input electrically coupled to an output of the amplifier of said receiving module and configured to apply the phase-shift Φ to a signal received on its input, the value of the phase-shift Φ being similar for all phase-shifters of the n receiving modules;
a mixer comprising a first input electrically coupled to an output of the phase-shifter of said receiving module and a second input electrically coupled to the output of an amplifier whose input is electrically coupled to an antenna to that of said receiving module, and configured to output a product of signals applied on its first and second inputs;
and wherein the antennas of the n receiving modules and the first antenna are aligned next to one another on the axis of alignment and such that the distances between each of the first antenna and of the antennas of the n receiving modules and an adjacent antenna are equal to one another.

3. The device according to claim 2, further including a circuit comprising several inputs electrically coupled to the outputs of the mixers of the n receiving modules and configured to perform a linear combination between signals applied on its inputs.

4. The device according to claim 3, wherein the linear combination corresponds to an addition.

5. The device according to claim 2, further including n−1 power dividers each comprising:
an input electrically coupled to the output of the amplifier of one of the n receiving modules;
a first output electrically coupled to the input of the phase-shifter of said one of then receiving modules;
a second output electrically coupled to the second input of the mixer of another one of the n receiving modules whose antenna is adjacent to that of said one of n receiving modules.

6. The device according to claim 1, wherein the receiving module further includes a low-pass filter whose input is electrically coupled to an output of the mixer of the receiving module.

7. The device according to claim 3, wherein each of the n receiving modules further includes a low-pass filter whose input is electrically coupled to an output of the mixer of said receiving module, and wherein the inputs of the circuit configured to perform a linear combination between the signals applied on its inputs are electrically coupled to the outputs of the low-pass filters of the n receiving modules.

8. The device according to claim 1, wherein a distance between two adjacent antennas of said device is equal to $\lambda/2$, with $\lambda$ corresponding to the wavelength of a carrier of the amplitude-modulated RF signal.

9. The device according to claim 1, wherein the phase-shifter of the receiving module or of each of the n receiving modules includes at least one vector modulator, and/or the mixer of the receiving module or of each of the n receiving modules includes at least one Gilbert cell.

10. A method for receiving an amplitude-modulated RF signal, comprising at least:

a reception of the amplitude-modulated RF signal by at least first and second antennas which output respectively the first and second reception signals, then an amplification of the first and second reception signals, then a phase-shifting $\Phi$ of the amplified second reception signal, then a multiplication of the amplified first reception signal with the amplified and phase-shifted second reception signal, and wherein the value of the phase-shift $\Phi$ is defined prior to the reception of the amplitude-modulated RF signal as a function of a particular value a of an angle $\alpha$ formed between a wavefront of the amplitude-modulated RF signal and an axis of alignment of the first and second antennas and of a value of a distance between the first and second antennas.

11. The method according to claim 10, wherein:

the reception of the amplitude-modulated RF signal is implemented by n+1 antennas which output n+1 reception signals and which are arranged such that the distance between each of the n+1 antennas and an adjacent antenna are equal to one another;

the amplification is implemented for each of the n+1 reception signals;

the phase-shifting $\Phi$ is implemented for n amplified reception signals;

the multiplication is implemented between each of the n amplified and phase-shifted reception signals and one of the n+1 amplified and non-phase-shifted reception signals originating from two of the n+1 antennas that are adjacent;

n being an integer greater than or equal 2.

12. The method according to claim 11, further including the implementation of a linear combination of the signals corresponding to the results of the implemented multiplications.

13. The method according to claim 12, wherein the linear combination corresponds to an addition.

14. The method according to claim 10, further including the implementation of a low-pass filtering of the signal corresponding to the result of the implemented multiplication or of each of the signals corresponding to the results of the implemented multiplications.

15. The method according to claim 10, further including a distance between two adjacent antennas used for the reception of the amplitude-modulated RF signal is equal to $\lambda/2$, with $\lambda$ corresponding to the wavelength of a carrier of the amplitude-modulated RF signal.

* * * * *